United States Patent
Hyugaji et al.

(10) Patent No.: US 10,536,089 B2
(45) Date of Patent: Jan. 14, 2020

(54) SWITCHING POWER SOURCE APPARATUS AND DIRECT-CURRENT POWER SOURCE APPARATUS

(71) Applicants: Takumi Hyugaji, Isehara (JP); Minoru Kado, Hachioji (JP)

(72) Inventors: Takumi Hyugaji, Isehara (JP); Minoru Kado, Hachioji (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/249,018

(22) Filed: Jan. 16, 2019

(65) Prior Publication Data
US 2019/0229635 A1  Jul. 25, 2019

(30) Foreign Application Priority Data
Jan. 22, 2018  (JP) ................................ 2018-007922

(51) Int. Cl.
*H02M 3/335* (2006.01)
*G01R 19/155* (2006.01)
*H02M 1/08* (2006.01)

(52) U.S. Cl.
CPC ...... *H02M 3/33592* (2013.01); *G01R 19/155* (2013.01); *H02M 1/08* (2013.01)

(58) Field of Classification Search
CPC ............ H02M 1/32; H02M 2001/0025; G01R 19/155
See application file for complete search history.

(56) References Cited

U.S. PATENT DOCUMENTS

| | | | |
|---|---|---|---|
| 8,023,291 B2* | 9/2011 | Sato | G01R 19/0084 363/127 |
| 2007/0201253 A1* | 8/2007 | Endo | H02M 1/083 363/127 |
| 2015/0023062 A1* | 1/2015 | Hyugaji | H02M 3/33592 363/16 |
| 2016/0036249 A1* | 2/2016 | Saji | H02M 3/33507 320/160 |
| 2016/0036340 A1* | 2/2016 | Kikuchi | H02M 1/32 363/21.14 |

(Continued)

FOREIGN PATENT DOCUMENTS

JP       2009278718 A      11/2009

*Primary Examiner* — Yusef A Ahmed
(74) *Attorney, Agent, or Firm* — Holtz, Holtz & Volek PC (57) ABSTRACT

A switching power source apparatus includes: a synchronous rectifier switching element for synchronous rectification constituted of an insulated-gate field-effect transistor; and a secondary-side control circuit including a detector circuit and a timer circuit. The secondary-side control circuit performs ON/OFF control of the synchronous rectifier switching element. The detector circuit monitors a voltage of a drain terminal of the synchronous rectifier switching element, and detects an abnormal state in which the voltage of the drain terminal is undetectable. The timer circuit starts up and measures a predetermined time in response to the detector circuit detecting the abnormal state. When the detector circuit detects the abnormal state, and the predetermined time elapses according to the timer circuit, the secondary-side control circuit outputs a detection signal indicating an abnormality to outside.

5 Claims, 6 Drawing Sheets

(56) References Cited

U.S. PATENT DOCUMENTS

| | | | |
|---|---|---|---|
| 2016/0072399 A1* | 3/2016 | Kikuchi | H02M 3/33592 |
| | | | 363/21.14 |
| 2016/0261200 A1* | 9/2016 | Yabuzaki | H02M 1/32 |
| 2016/0261204 A1* | 9/2016 | Kikuchi | H02M 3/33523 |
| 2016/0308452 A1* | 10/2016 | Motoki | H02M 3/33523 |
| 2018/0006569 A1* | 1/2018 | Kikuchi | H02M 3/33592 |
| 2019/0149056 A1* | 5/2019 | Zheng | H02M 1/32 |
| | | | 363/21.13 |
| 2019/0181634 A1* | 6/2019 | Saji | H02H 1/0007 |
| 2019/0222132 A1* | 7/2019 | Kikuchi | H02M 1/08 |

* cited by examiner

SWITCHING POWER SOURCE APPARATUS AND DIRECT-CURRENT POWER SOURCE APPARATUS

BACKGROUND

1. Technological Field

The present invention relates to a direct-current power source apparatus employing a switching control system and including a transformer for voltage conversion. For example, the present invention relates to a technology effective by being used in an insulated DC-DC converter including a synchronous rectifier switch on a secondary side of the transformer.

Description of the Related Art

As one type of switching power source apparatus, there is a switching power source apparatus (insulated DC-DC converter) including: an MOS transistor (insulated-gate field-effect transistor) as a switching element for intermittently flowing current to a primary-side coil of a transformer; and a control circuit (IC) which performs ON/OFF control of the MOS transistor, wherein a voltage is induced in the secondary side of the transformer by current in the primary side of the transformer, current flowed thereby in a secondary-side coil is rectified by a diode, and the voltage is smoothed and output by a capacitor.

In an insulated DC-DC converter using a rectifier diode in a circuit on the secondary side (hereinafter "secondary-side circuit"), loss in the rectifier diode is large, and this causes reduction in efficiency. Then, for example, as disclosed in JP 2009-278718 A, there is a technology for reducing loss in a rectifier element and increasing efficiency by: instead of a rectifier diode in the secondary-side circuit, using a switching element (MOS transistor) for synchronous rectification in the secondary-side circuit; and, with a secondary-side control circuit, detecting a terminal voltage (source-drain voltage) of a secondary-side switching element, and performing turn-on control of the secondary-side switching element in sync with an ON timing of a switching element in a circuit on the primary side (hereinafter "primary-side circuit".

In a conventional insulated power source apparatus with a switching control system, which includes the one disclosed in JP 2009-278718 A, if a state in which the terminal voltage (drain voltage) of the secondary-side switching element is undetectable occurs by breaking of wire or the like, current flows through a body diode parasitic on an MOS transistor as the secondary-side switching element. This avoids a situation of no output voltage from the secondary side.

In the conventional insulated power source apparatus, if a line is accidentally disconnected from the drain terminal of the MOS transistor as the secondary-side switching element (drain open) by poor soldering or impact on the apparatus, no ON/OFF control signal for the secondary-side switching element is output from the secondary-side control circuit. Consequently, current keeps flowing through the body diode. This creates problems that the element (s) generates heat by the current, and a voltage conversion efficiency of the power source apparatus decreases. Then, there maybe an idea of stopping operation of the apparatus at the time of occurrence of the drain open. However, the primary side and the secondary side are insulated from one another by the transformer. Hence, the primary-side circuit cannot directly detect the drain open, which occurs on the secondary side, and accordingly cannot stop operation of the apparatus.

SUMMARY

The present invention has been conceived in view of the above problems, and objects of the present invention include, in a switching power source apparatus including a transformer for voltage conversion and a synchronous rectifier element on the secondary side, detecting, on the secondary side, occurrence of the state in which the terminal voltage of the synchronous rectifier element on the secondary side is undetectable, and performing abnormality informing or stopping the power source apparatus, thereby suppressing loss or heat generation in the synchronous rectifier element.

To achieve at least one of the abovementioned objects, according to an aspect of the present invention, there is provided a switching power source apparatus including: a transformer for voltage conversion; a main switching element connected to a primary-side coil of the transformer in series; a primary-side control circuit which performs ON/OFF control of the main switching element; a synchronous rectifier switching element for synchronous rectification connected to a secondary-side coil of the transformer in series; and a secondary-side control circuit which performs ON/OFF control of the synchronous rectifier switching element, wherein the synchronous rectifier switching element is an insulated-gate field-effect transistor, the secondary-side control circuit includes: a detector circuit which monitors a voltage of a drain terminal of the synchronous rectifier switching element, and detects an abnormal state in which the voltage of the drain terminal is undetectable; and a timer circuit which starts up and measures a predetermined time in response to the detector circuit detecting the abnormal state, and when the detector circuit detects the abnormal state, and the predetermined time elapses according to the timer circuit, the secondary-side control circuit outputs a detection signal indicating an abnormality to outside.

BRIEF DESCRIPTION OF THE DRAWINGS

The advantages and features provided by one or more embodiments of the present invention will become more fully understood from the detailed description given hereinbelow and the appended drawings which are given by way of illustration only, and thus are not intended as a definition of the limits of the present invention, wherein.

DETAILED DESCRIPTION OF EMBODIMENTS

Hereinafter, one or more preferred embodiments of the present invention will be described with reference to the drawings.

Figure 1:
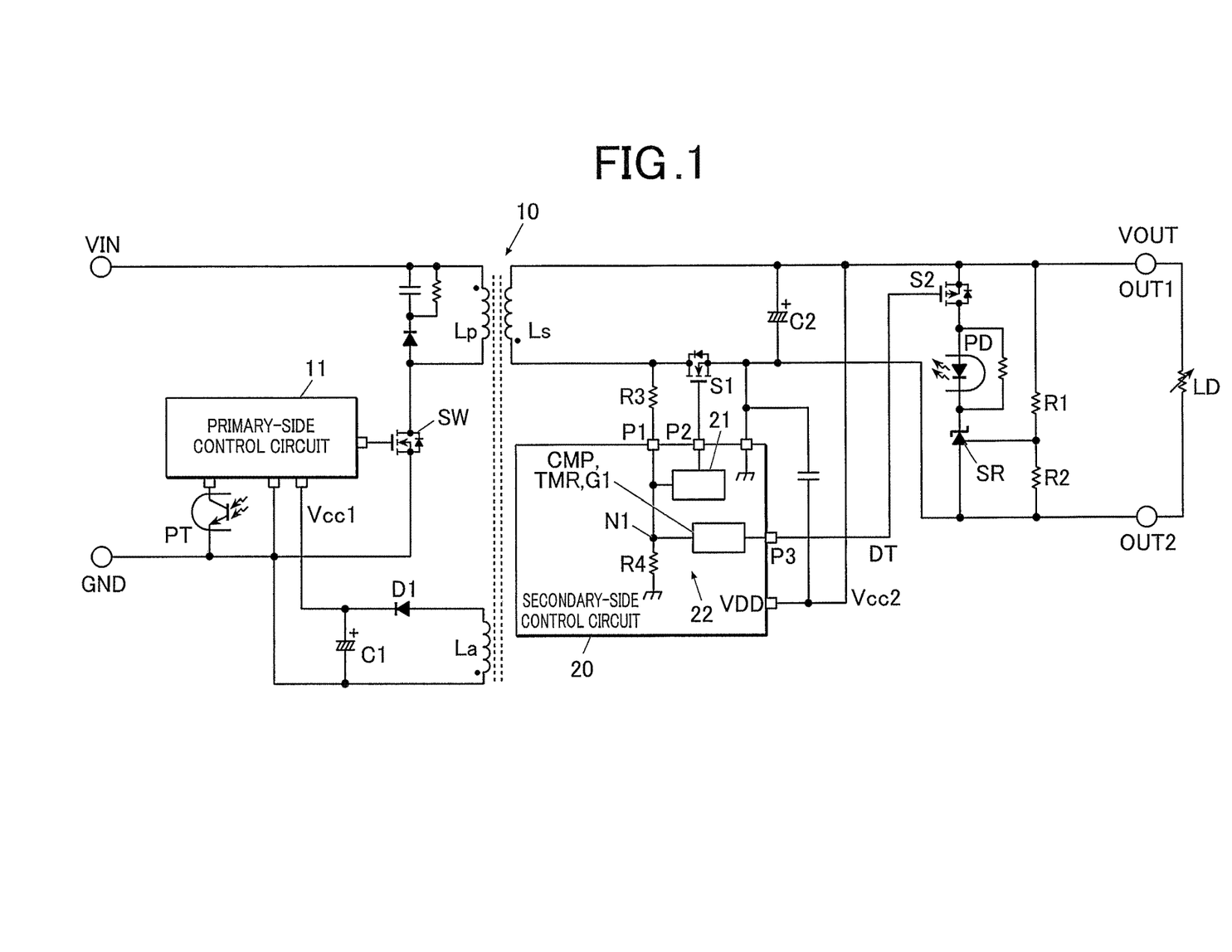
FIG. 1 is a circuit diagram showing an embodiment of a switching power source apparatus with a synchronous rectification system, the apparatus to which the present invention is applied.

FIG. 1 shows an embodiment of a switching power source apparatus with a synchronous rectification system, the apparatus to which the present invention is applied.

The switching power source apparatus of this embodiment is configured as an insulated DC-DC converter, and includes: a transformer 10 for voltage conversion including a primary-side coil Lp, a secondary-side coil Ls, and an auxiliary winding La; on the primary side, a switching element SW constituted of an N channel MOS transistor, and a control circuit (primary-side control circuit) 11 therefor; and on the secondary side, an MOS transistor S1, and a control circuit (secondary-side control circuit) 20 therefor. The transformer 10 uses the secondary-side coil Ls having reversed polarity to that of the primary-side coil Lp, so that the power source apparatus operates as a flyback converter.

The switching element SW on the primary side is connected to the primary-side coil Lp of the transformer 10 in series. The primary-side control circuit 11 and the secondary-side control circuit 20 are each configured as a semiconductor integrated circuit (IC) provided on one semiconductor chip, or as a semiconductor device installed in one package. Between the terminals of the auxiliary winding La of the transformer 10, a diode D1 and a capacitor C1 are connected in series. A voltage induced in the auxiliary winding La is rectified by the diode D1 and smoothed by the capacitor C1, so that a power supply voltage VCC1 for the primary-side control circuit 11 is generated and supplied to the primary-side control circuit 11.

The DC-DC converter of this embodiment further includes a phototransistor PT for light receiving which is connected to the primary-side control circuit 11, and receives a feedback signal (s) from the secondary-side circuit. The primary-side control circuit 11 changes a switching frequency or a duty ratio of the switching element SW in accordance with the feedback signal so as to deal with change in load.

The DC-DC converter includes on the secondary side of the transformer 10: the MOS transistor S1 for synchronous rectification (hereinafter "synchronous rectifier MOS transistor S1") connected between one terminal of the secondary-side coil Ls and an output terminal OUT2; the secondary-side control circuit 20 which generates an ON/OFF control signal (s) for the synchronous rectifier MOS transistor by taking a voltage generated on the secondary side as a power supply voltage and detecting a source-drain voltage of the synchronous rectifier MOS transistor S1; and a smoothing capacitor C2 which is connected between an output terminal OUT1 and the output terminal OUT2, and stabilizes an output voltage VOUT. A variable resistance LD connected between the output terminals OUT1 and OUT 2 represents a load.

To the output terminal OUT1, a power supply terminal VDD of the secondary-side control circuit 20 is connected, and an output voltage VOUT is supplied to the secondary-side control circuit 20 as a power supply voltage VCC2.

The DC-DC converter further includes on the secondary side of the transformer 10: a photodiode PD for feedback connected between the output terminals OUT1 and OUT2; a shunt regulator SR which is connected to the photodiode PD in series, and flows current corresponding to a potential of the output voltage VOUT; and an MOS transistor S2 as a switch (hereinafter "switch MOS transistor S2") connected to the photodiode PD and the shunt regulator SR in series.

Between the output terminals OUT1 and OUT2, resistors R1 and R2 for voltage dividing are connected. A divided voltage obtained by dividing the output voltage VOUT by a resistance ratio of the resistors R1 and R2 is applied to the shunt regulator SR, so that the shunt regulator SR flows current proportional to the level of the output voltage VOUT to the photodiode PD.

The photodiode PD on the secondary side and the phototransistor PT on the primary side constitute photo-interrupter as an insulated signal transmitter. Light emitted from the photodiode PD on the secondary side is received by the phototransistor PT on the primary side, and a signal corresponding to intensity of the light is generated. The primary-side control circuit 11 controls the switching element SW in accordance with this signal, which is based on the feedback signal.

The secondary-side control circuit 20 includes a switching control circuit 21. The switching control circuit 21 monitors a voltage of an external terminal (voltage monitoring terminal) P1 to which one terminal of a line is connected, the line having the other terminal connected, via a resistor R3, to the drain terminal of the synchronous rectifier MOS transistor S1 as a secondary-side switching element; generates the control signal to turn on or off the synchronous rectifier MOS transistor S1 at a predetermined timing; and outputs the control signal to the gate terminal of the synchronous rectifier MOS transistor S1 via an external terminal P2.

The secondary-side control circuit 20 further includes a drain open detector circuit 22 which detects the state in which the line is disconnected from the drain terminal of the synchronous rectifier MOS transistor S1 (drain open), and outputs a detection signal DT. The output drain open detection signal DT is supplied to the gate terminal of the switch MOS transistor S2 connected to the photodiode PD in series. When the drain open detector circuit 22 detects the drain open, the secondary-side control circuit 20 controls the switch MOS transistor S2 to be in an OFF state.

When the switch MOS transistor S2 is turned off, no current flows into the photodiode PD, and accordingly no light enters the phototransistor PT on the primary side, so that the primary-side control circuit 11 detects occurrence of the drain open, and stops operation of the power source apparatus, for example, by stopping ON/OFF control of the switching element SW.

Next, a first example of the drain open detector circuit 22 of the secondary-side control circuit 20 having the above function(s) will be described with reference to FIG. 2.

Figure 2:
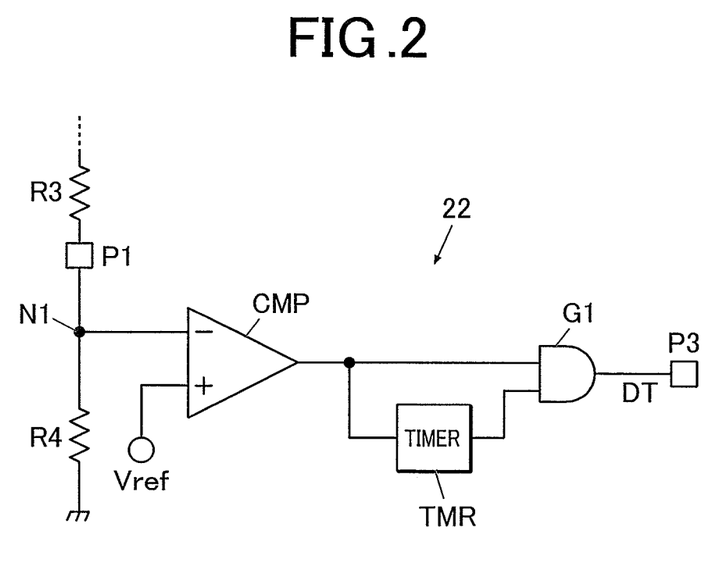
FIG. 2 is a circuit diagram showing an example of a drain open detector circuit provided in a secondary-side control circuit of the switching power source apparatus of the embodiment.

The drain open detector circuit 22 of the first example includes, as shown in FIG. 2: a pull-down resistor R4 connected between a ground point and, of the IC, the external terminal P1 to which the one terminal of the line is connected, the line having the other terminal connected, via the resistor R3, to the drain terminal of the synchronous rectifier MOS transistor S1; a comparator CMP as a voltage comparator circuit the inverting input terminal (−) of which is connected to a connection node N1 of the resistors R3 and R4; a timer circuit TMR which starts up and measures a predetermined time at the timing of change in the output of the comparator CMP; an AND gate G1 which takes the outputs of the comparator CMP and the timer circuit TMR as the input (s); and an external terminal P3 which outputs an output signal of the AND gate G1 to the outside of the chip.

A reference voltage Vref applied to the non-inverting input terminal (+) of the comparator CMP is set at a value relatively close to the ground potential. In the drain open detector circuit 22 of this example, in the normal state, current flows into the resistors R3 and R4, so that the potential of the connection node N1 is higher than the reference voltage Vref, and the output of the comparator CMP is fixed at a low level.

On the other hand, if the state in which the line is disconnected from the drain terminal of the synchronous rectifier MOS transistor S1 (drain open) occurs, no current flows into the resistors R3 and R4, and the potential of the connection node N1 is pulled down to the ground potential by the pull-down resistor R4.

Then, the output of the comparator CMP changes to a high level and also the timer circuit TMR starts up, and when the predetermined time elapses, the output of the timer circuit TMR changes to the high level, and the detection signal DT of the high level is output from the AND gate G1 to the external terminal P3.

This turns off the switch MOS transistor S2, so that no current flows into the photodiode PD, and accordingly no light (or reduced light) enters the phototransistor PT on the primary side. Thus, the primary-side control circuit 11 can detect occurrence of the drain open in the secondary-side circuit.

As the pull-down resistor R4, a resistor having a resistance value sufficiently larger than ON resistance of the synchronous rectifier MOS transistor S1 is used. This prevents influence of current becoming large on behavior of the secondary-side control circuit 20 during normal operation, namely, during electrical continuity of the synchronous rectifier MOS transistor S1.

Further, a measurement time Ta measured by the timer circuit TMR is set to be longer than a period Tb (several milliseconds to several seconds) in which ON/OFF control of the switching element SW stops by the burst operation or the like performed by the primary-side control circuit 11 at the time of no load or a light load (Ta>Tb). This can prevent the drain open detector circuit 22 from mistakenly determining the burst operation performed on the primary side at the time of no load or a light load as the drain open.

Figure 5:
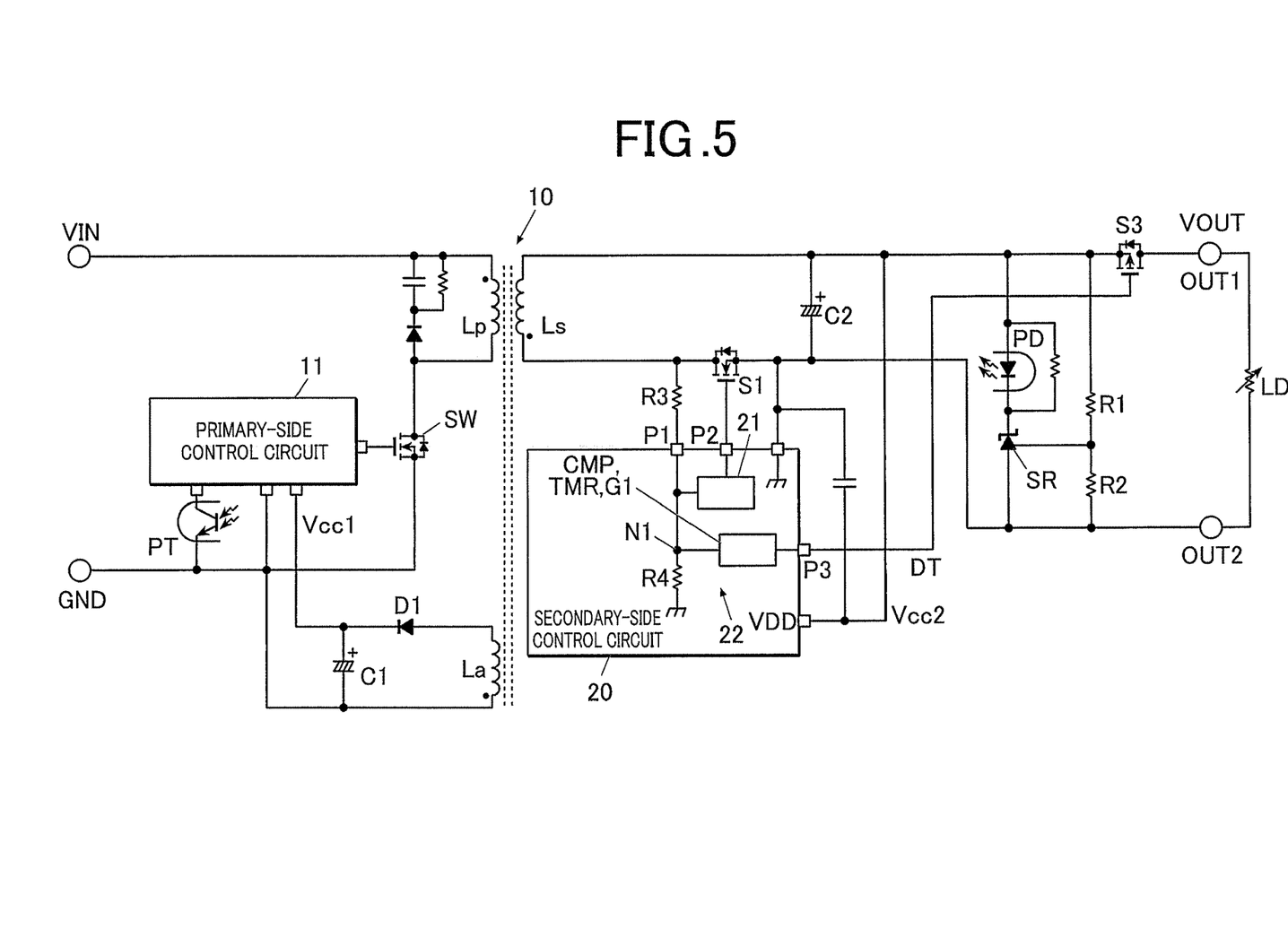
FIG. 5 is a circuit diagram showing an embodiment of the switching power source apparatus with the synchronous rectification system, the apparatus to which the present invention is applied.

Instead of the switch MOS transistor S2, which is shown in FIG. 1, connected to the photodiode PD in series, as shown in FIG. 5, an MOS transistor S3 as a current switch (hereinafter "current switch MOS transistor S3") may be connected to the load LD in series. In this case, the detection signal DT output from the AND gate G1 is supplied to the gate terminal of this current switch MOS transistor S3. When the drain open detector circuit 22 detects the drain open of the synchronous rectifier MOS transistor S1, the drain open detector circuit 22 (secondary-side control circuit 20) turns off the current switch MOS transistor S3, thereby blocking current to be supplied to the load LD. This can prevent current from flowing into the body diode of the synchronous rectifier MOS transistor S1 and thereby suppress heat generation.

Figure 3:
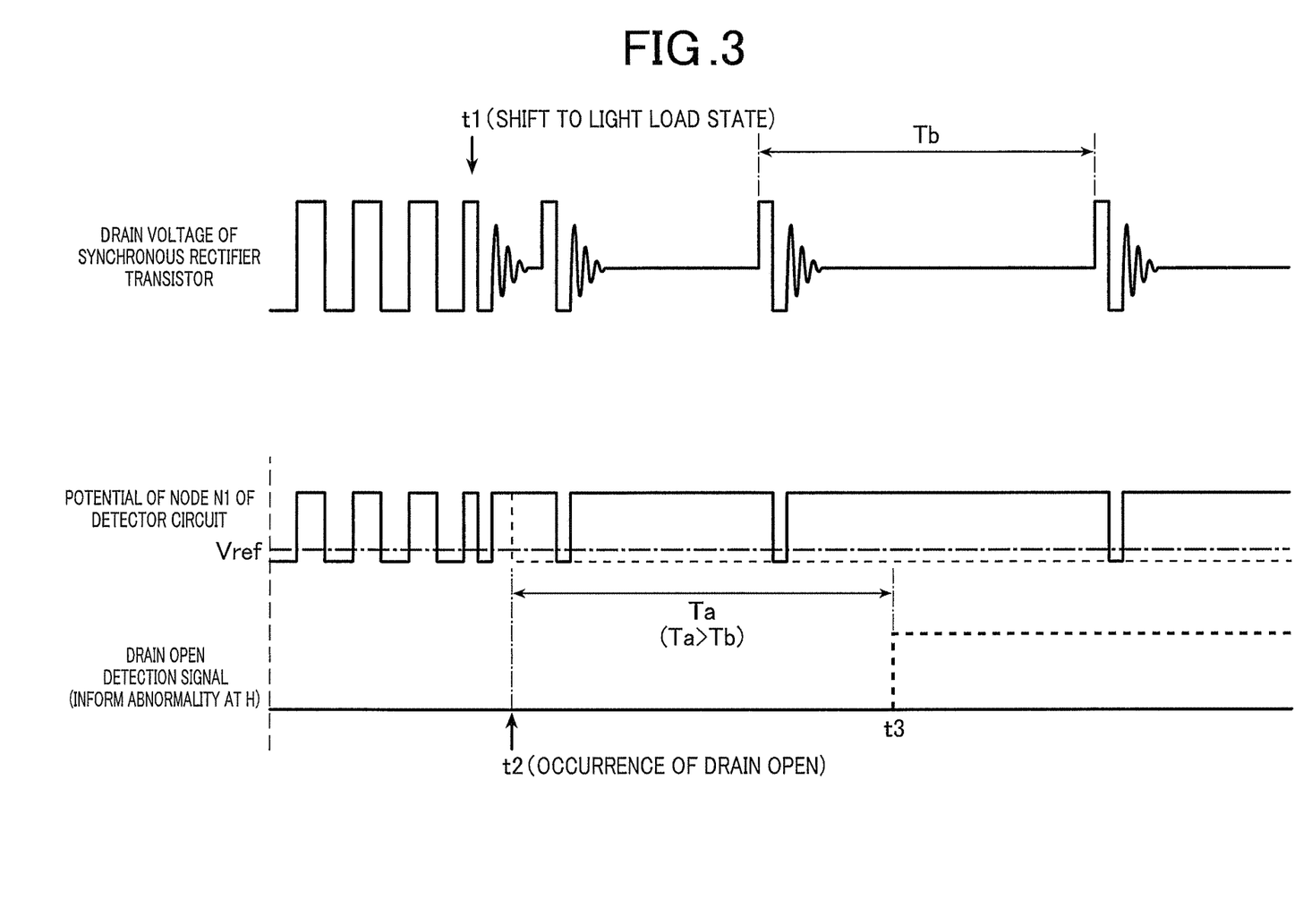
FIG. 3 is a waveform diagram showing states of a drain voltage of a synchronous rectifier switching element (MOS transistor), a voltage of a node of the drain open detector circuit, and change in a drain open detection signal on the secondary side in a case where burst operation occurs during normal operation in the switching power source apparatus of the embodiment.

FIG. 3 shows waveforms showing states of the drain voltage of the synchronous rectifier MOS transistor S1, the voltage of the node N1 of the drain open detector circuit 22, and change in the drain open detection signal DT on the secondary side in the case where the burst operation occurs on the primary side during the normal operation in the switching power source apparatus of this embodiment. In FIG. 3, about the potential of the node N1 of the detection circuit 22 and the drain open detection signal DT, solid lines indicate waveforms thereof when no problem occurs in the drain line, whereas broken lines indicate waveforms thereof when the drain open occurs, as an example.

As shown in FIG. 3, if the power source apparatus shifts to a light load state at a timing t1, the feedback signal to the primary-side control circuit 11 changes, and the primary-side control circuit 11 detects a light load, and performs the burst operation. Then, a change period of the drain voltage of the synchronous rectifier MOS transistor S1 becomes long. At the time, however, the detection signal DT output from the drain open detector circuit 22 is as it is, namely, stays at the low level as indicated by the solid line.

Meanwhile, if, for example, the drain open occurs at a timing t2 shown in FIG. 3, the voltage of the node N1 of the drain open detector circuit 22 is stuck at the low level as indicated by the broken line. The drain open detector circuit 22 detects this, and the timer circuit TMR starts up. After the predetermined measurement time Ta, as indicated by the broken line, the detection signal DT changes to the high level (at t3) which indicates occurrence of an abnormality.

Next, a second example of the drain open detector circuit 22 will be described.

Figure 4A:
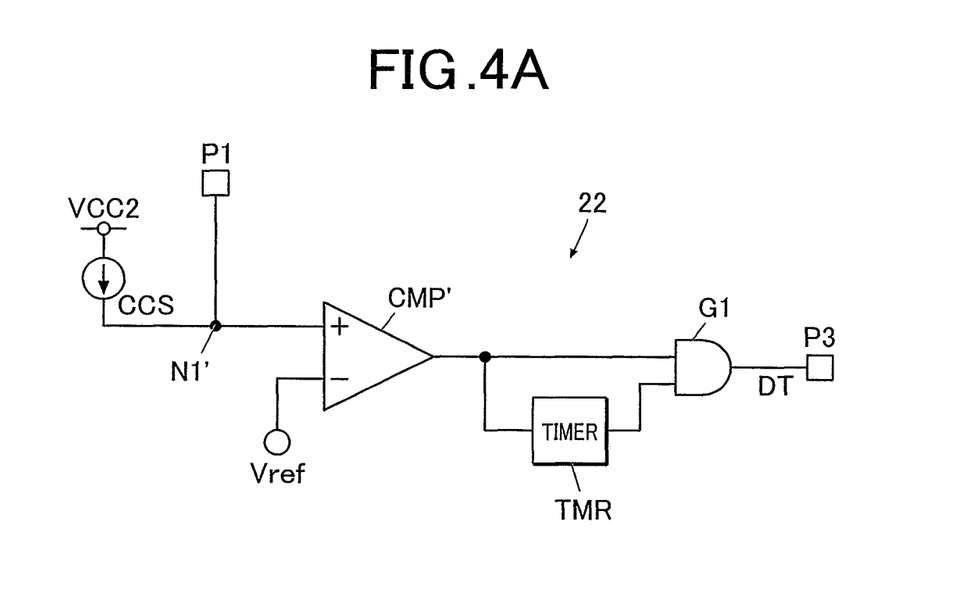
FIG. 4A is a circuit diagram showing another example of the drain open detector circuit provided in the secondary-side control circuit of the switching power source apparatus of the embodiment.

In the second example of the drain open detector circuit 22, instead of the pull-down resistor R4 shown in FIG. 2, a constant current source CCS is provided as shown in FIG. 4A. More specifically, the constant current source CCS is connected between a line which supplies the power supply voltage VCC2 and a node N1' connected to the external terminal P1, and the non-inverting input terminal of a comparator CMP' is connected to the node N1'. Other than the above, the drain open detector circuit 22 has the same configuration as that shown in FIG. 2. Instead of the constant current source CCS, a pull-up resistor may be used.

In the drain open detector circuit 22 of the second example, if the state in which the line is disconnected from the drain terminal of the synchronous rectifier MOS transistor S1 (drain open) occurs, no current flows into the resistor R3, and the potential of the connection node N1' is pulled up to the power supply voltage VCC2 by the constant current source CCS. Then, the output of the comparator CMP' changes to the high level and also the timer circuit TMR starts up, and when the predetermined time elapses, the output of the timer circuit TMR changes to the high level, and the detection signal DT of the high level is output from the AND gate G1 to the external terminal P3.

Further, in the second example, instead of the switch MOS transistor S2, which is shown in FIG. 1, connected to the photodiode PD in series, as shown in FIG. 5, the current switch MOS transistor S3 is connected to the load LD in series, and when the drain open detector circuit 22 detects the drain open of the synchronous rectifier MOS transistor S1, the drain open detector circuit 22 (secondary-side control circuit 20) turns off the current switch MOS transistor S3, thereby blocking current to be supplied to the load LD.

This can prevent current from flowing into the body diode of the synchronous rectifier MOS transistor S1 and thereby suppress heat generation.

Instead of the current switch MOS transistor S3 connected to the load LD in series, as with that shown in FIG. 1, the switch MOS transistor S2 connected to the photodiode PD in series may be provided to inform the primary-side control circuit 11 about occurrence of the drain open and stop operation thereof.

Next, a third example of the drain open detector circuit 22 will be described.

Figure 4B:
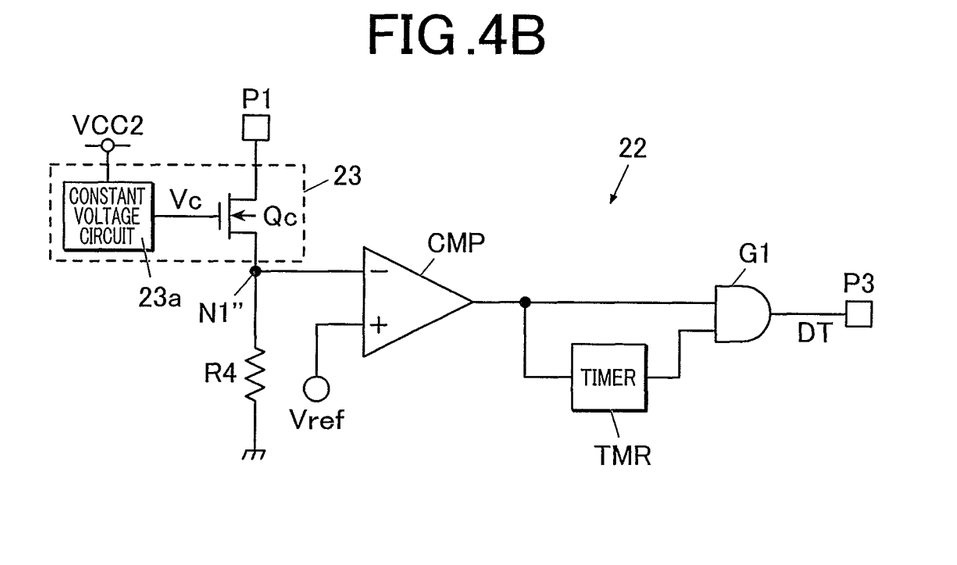
FIG. 4B is a circuit diagram showing another example of the drain open detector circuit provided in the secondary-side control circuit of the switching power source apparatus of the embodiment.

In the third example of the drain open detector circuit 22, a clamp circuit 23 is provided. The clamp circuit 23 clamps the potential of the external terminal P1 of the IC. To the external terminal P1, the one terminal of the line is connected, the line having the other terminal connected to the drain terminal of the synchronous rectifier MOS transistor S1 via the resistor R3.

More specifically, as shown in FIG. 4B, an MOS transistor Qc is provided between the resistors R3 and R4, which are connected in series as shown in FIG. 2, a constant voltage Vc generated by a constant voltage circuit 23a is applied to the gate terminal of the MOS transistor Qc, and the inverting input terminal of the comparator CMP is connected to a connection node N1" of the MOS transistor Qc and the resistor R4. Depending on the configuration of the power source apparatus, the peak of the drain voltage of the synchronous rectifier MOS transistor S1 could increase to several tens to several hundreds of volts. Providing the clamp circuit 23 can suppress variation of voltage in the IC on the secondary side.

Other than the above, the drain open detector circuit 22 has the same configuration as that shown in FIG. 2, and if the state in which the line is disconnected from the drain terminal of the synchronous rectifier MOS transistor S1 (drain open) occurs, no current flows into the resistors R3 and R4, and the potential of the connection node N1" is pulled down to the ground potential by the pull-down resistor R4, and when the predetermined time elapses, the detection signal of the high level is output from the AND gate G1.

This turns off the switch MOS transistor S2, so that no current flows into the photodiode PD, and accordingly no light enters the phototransistor PT on the primary side. Thus, the primary-side control circuit 11 can detect occurrence of the drain open.

In this example too, instead of the switch MOS transistor S2, which is shown in FIG. 1, connected to the photodiode PD in series, as shown in FIG. 5, the current switch MOS transistor S3 may be connected to the load LD in series to block current to flow into the load LD at the time of occurrence of the drain open.

Next, a second embodiment of the present invention will be described with reference to FIG. 6.

Figure 6:
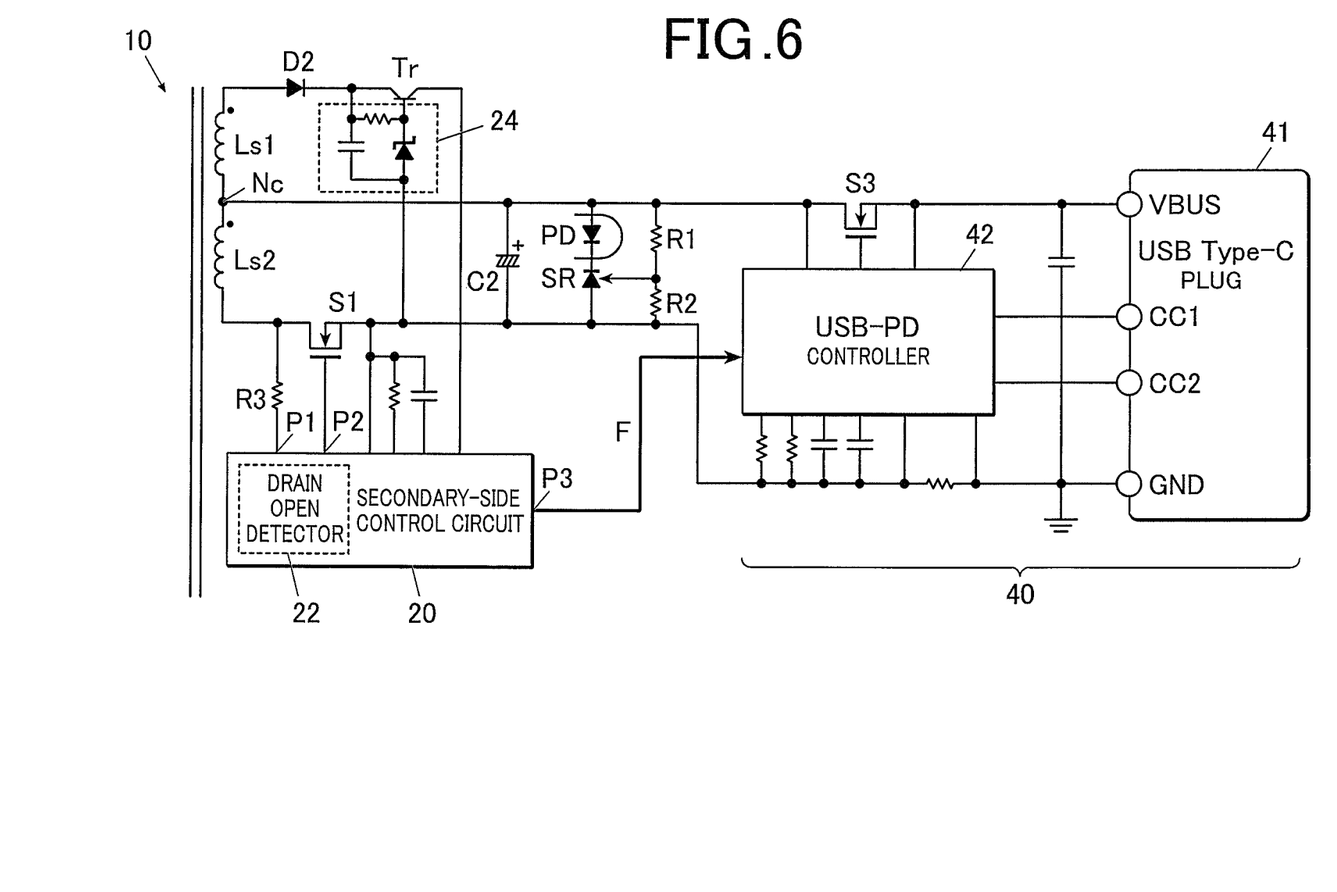
FIG. 6 is a circuit diagram showing a system configuration example of the switching power source apparatus of an embodiment applied to a direct-current power source apparatus having a USB Type-C plug.

In FIG. 6, the power source apparatus of this embodiment is applied to a system in which a universal serial bus (USB) standard power supply apparatus 40 is connected as a load circuit to a power source apparatus. The primary-side circuit is the same as that in the first embodiment (shown in FIG. 1), and not shown in FIG. 6 due to space limitations.

The power supply apparatus 40 includes a USB Type-C plug 41 having four terminals VBUS, CC1, CC2 and GND, and a USB power delivery (USB-PD) controller 42 connected to the terminals CC1 and CC2 of the plug 41.

The USB-PD is an independent standard which is compatible with conventional cables and connectors, and also compatible with USB 2.0, USB 3.1, and USB battery charging (BC) 1.2. In this standard, charging voltage is selectable from 5 V, 12 V and 20 V, charging current is selectable from 1.5 A, 2 A, 3 A and 5 A, and USB charging/power-feeding is available up to 10 W, 18 W, 36 W, 65 W or the maximum of 100 W.

In the power source apparatus of this embodiment, to the middle point (connection node of a first coil Ls1 and a second coil Ls2) Nc of the secondary-side coil of the transformer 10, the terminal VBUS of the Type-C plug 41 is connected via a switch MOS transistor S3, and the gate terminal of this transistor S3 is ON/OFF controlled by the USB-PD controller 42. The first coil Ls1 is an auxiliary winding for supplying a power supply voltage to the secondary-side control circuit 20.

The synchronous rectifier MOS transistor S1 is connected to the second coil Ls2 in series, and on the first coil Ls1 side, a rectifier diode D2, a bipolar transistor Tr, and a base drive circuit 24 are provided. The base drive circuit 24 takes the drain voltage of the synchronous rectifier MOS transistor S1 as the input, and turns on the bipolar transistor Tr.

The secondary-side control circuit 20 includes the drain open detector circuit 22, as with the secondary-side control circuit 20 in the first embodiment. In this embodiment, the drain open detection signal output from the drain open detector circuit 22 in the secondary-side control circuit 20 is supplied to the USB-PD controller 42 as a flag signal F. When receiving the flag signal F, the USB-PD controller 42 activates a protection function so as to turn off the switch MOS transistor S3. This can stop outputting current to devices or circuits connected to the Type-C plug 41, suppress current that flows into the body diode of the synchronous rectifier MOS transistor S1, and reduce heat generation or loss in the synchronous rectifier MOS transistor S1.

In the above, the present invention has been described in detail on the basis of some embodiment(s). However, the present invention is not limited to the embodiments or the like. For example, in the embodiments or the like, as a circuit which is connected to the photodiode PD in series and flows current corresponding to the potential of the output voltage VOUT, the shunt regulator SR is used. Alternatively, the circuit may be configured by: a transistor connected to the photodiode PD in series; and an error amplifier which takes the divided voltage obtained by dividing the output voltage VOUT by the resistors R1 and R2 for voltage dividing as the input, outputs a voltage corresponding to a potential difference between the divided voltage and the reference voltage, and controls the transistor.

Further, in the embodiment(s), the switch MOS transistor S2 connected in series to the photodiode PD, which is for sending the feedback signal of the output to the primary-side circuit, is provided to send the detection signal of the drain open of the synchronous rectifier MOS transistor S1. There is a power source apparatus having a function of sending an enable signal from the secondary-side circuit to the primary-side circuit, other than the photodiode, which is for sending the feedback signal. In such a power source apparatus, the drain open detection signal may be sent by being superimposed on the enable signal. Alternatively, a photodiode and a phototransistor exclusively used for sending the drain open detection signal may be provided.

Further, the drain open detection system described in the embodiment(s) is applicable to not only the flyback converter shown in FIG. 1 but also other power source systems. For example, if, like a forward converter, a half bridge converter or the like, two or more rectifier elements are present on the secondary side, and synchronous rectifier MOS transistors are used as these rectifier elements, the drain open detection system can be applied to each of these MOS transistors to detect the drain open.

As described above, according to an aspect of the present invention, there is provided a switching power source apparatus including: a transformer for voltage conversion; a main switching element connected to a primary-side coil of the transformer in series; a primary-side control circuit which performs ON/OFF control of the main switching element; a synchronous rectifier switching element for synchronous rectification connected to a secondary-side coil of the transformer in series; and a secondary-side control circuit which performs ON/OFF control of the synchronous rectifier switching element, wherein the synchronous rectifier switching element is an insulated-gate field-effect transistor, the secondary-side control circuit includes: a detector circuit which monitors a voltage of a drain terminal of the synchronous rectifier switching element, and detects an abnormal state in which the voltage of the drain terminal is undetectable; and a timer circuit which starts up and measures a predetermined time in response to the detector circuit detecting the abnormal state, and when the detector circuit detects the abnormal state, and the predetermined time elapses according to the timer circuit, the secondary-side control circuit outputs a detection signal indicating an abnormality to outside.

According to the above switching power source apparatus, if the abnormal state in which the voltage of the drain terminal of the synchronous rectifier switching element is undetectable is detected, the detection signal indicating the abnormality is output to the outside. Hence, performing control not to output the ON/OFF control signal for the synchronous rectifier switching element from the secondary-side control circuit to prevent current from flowing through the body diode of the synchronous rectifier switching element and thereby suppress loss can increase power efficiency. Further, when the abnormal state is detected, and the predetermined time elapses according to the timer circuit, the detection signal indicating the abnormality is output to the outside. Hence, setting the time measured by the timer circuit to be longer than the burst operation period in the power source apparatus which performs the burst operation can prevent the power source apparatus from mistakenly detecting the burst operation as the abnormal state.

Preferably, the switching power source apparatus further includes, on a secondary side of the transformer, a signal sending unit which sends a signal corresponding to an output voltage of the secondary side to the primary-side control circuit; and a current control unit which is connected to the signal sending unit in series and controls current that flows into the signal sending unit, wherein the current control unit changes the current that flows into the signal sending unit in response to the detection signal output from the secondary-side control circuit, and the primary-side control circuit detects a change in the signal sent by the signal sending unit, and stops the ON/OFF control of the main switching element.

According to this configuration, if the abnormal state in which the voltage of the drain terminal of the synchronous rectifier switching element is undetectable occurs, the primary-side control circuit is informed about the occurrence of the abnormal state, and stops the ON/OFF control of the main switching element, which is on the primary side. This can prevent current from flowing through the body diode of the synchronous rectifier switching element on the secondary side and thereby suppress heat generation or loss.

Preferably, the switching power source apparatus further includes a switch unit provided between a terminal of the secondary-side coil of the transformer and a voltage output terminal which outputs a voltage rectified and smoothed on the secondary side, the switch unit supplying/blocking the rectified and smoothed voltage, wherein the switch unit is ON/OFF controlled in response to the detection signal output from the secondary-side control circuit.

According to this configuration, if the abnormal state in which the voltage of the drain terminal of the synchronous rectifier switching element is undetectable occurs, in response to the detection signal output from the secondary-side control circuit, current to be supplied to a load is blocked. This can prevent current from flowing through the body diode of the synchronous rectifier switching element on the secondary side and thereby suppress heat generation or loss.

Preferably, the detector circuit includes: a voltage dividing unit which divides the voltage of the drain terminal of the synchronous rectifier switching element; a determination circuit which compares (i) a divided voltage obtained by the voltage dividing unit dividing the voltage of the drain terminal with (ii) a reference voltage of a predetermined potential, thereby determining the abnormal state; and an AND circuit which takes an output signal of the determination circuit and an output signal of the timer circuit as an input, and the timer circuit starts measuring the predetermined time in response to the determination circuit determining that the abnormal state has occurred.

This enables a relatively simple and small-sized circuit to detect occurrence of the abnormal state in which the voltage of the drain terminal of the synchronous rectifier switching element is undetectable.

Preferably, the voltage dividing unit includes a resistor element connected between a voltage monitoring terminal to which the voltage of the drain terminal of the synchronous rectifier switching element is input and a ground point, and the switching power source apparatus further includes a clamp circuit including a transistor which is provided between the voltage monitoring terminal and the ground point, and is connected to the resistor element in series.

According to this configuration, in the power source apparatus in which the drain voltage of the synchronous rectifier switching element could increase to several tens to several hundreds of volts, the potential of the terminal to which the drain voltage is input can be clamped. This can prevent elements constituting the secondary-side control circuit from being damaged by a high voltage being applied to the elements. Further, if the secondary-side control circuit is configured as a semiconductor integrated circuit (IC), it is unnecessary to use high-voltage (high-voltage resistant) elements as the internal elements of the IC.

Further, according to another aspect of the present invention, there is provided a direct-current power source apparatus including: the switching power source apparatus; a USB Type-C plug connected to an output terminal on a secondary side of the transformer; a controller which controls the Type-C plug; and a switch unit connected between a terminal of the secondary-side coil of the transformer and a power supply terminal of the Type-C plug, wherein the detection signal output from the secondary-side control circuit is supplied to the controller, and the controller controls the switch unit in response to the detection signal.

This can provide a direct-current power source apparatus usable for supplying a power supply voltage to USB devices, portable devices and so forth, and also usable for charging secondary cells.

The present invention has advantageous effects of, in a power source apparatus employing a switching control system and including a transformer for voltage conversion and a synchronous rectifier element on the secondary side, detecting, on the secondary side, occurrence of the state in which the terminal voltage of the synchronous rectifier element on the secondary side is undetectable, and performing abnormality informing or stopping the power source apparatus, thereby suppressing loss or heat generation in the synchronous rectifier element.

Although one or more embodiments of the present invention have been described and shown in detail, the disclosed embodiments are made for purposes of illustration and example only and not limitation. The scope of the present invention should be interpreted by terms of the appended claims.

The entire disclosure of Japanese Patent Application No. 2018-007922 filed on Jan. 22, 2018 is incorporated herein by reference in its entirety.

What is claimed is:

1. A switching power source apparatus comprising:
a transformer for voltage conversion;
a main switching element connected to a primary-side coil of the transformer in series;
a primary-side control circuit which performs ON/OFF control of the main switching element;
a synchronous rectifier switching element for synchronous rectification connected to a secondary-side coil of the transformer in series; and
a secondary-side control circuit which performs ON/OFF control of the synchronous rectifier switching element,
wherein:
the synchronous rectifier switching element comprises an insulated-gate field-effect transistor,
the secondary-side control circuit includes:
  a detector circuit which monitors a voltage of a drain terminal of the synchronous rectifier switching element, and detects an abnormal state in which the voltage of the drain terminal is undetectable; and
  a timer circuit which starts up and measures a predetermined time in response to the detector circuit detecting the abnormal state,
when the detector circuit detects the abnormal state, and the predetermined time elapses according to the timer circuit, the secondary-side control circuit outputs a detection signal indicating an abnormality,
the detector circuit includes:
  a voltage dividing unit which divides the voltage of the drain terminal of the synchronous rectifier switching element;
  a determination circuit which compares (i) a divided voltage obtained by the voltage dividing unit dividing the voltage of the drain terminal with (ii) a reference voltage of a predetermined potential, thereby determining the abnormal state; and
  an AND circuit which receives an output signal of the determination circuit and an output signal of the timer circuit as an input,
the timer circuit starts measuring the predetermined time in response to the determination circuit determining that the abnormal state has occurred,
the voltage dividing unit includes a resistor element connected between a voltage monitoring terminal to which the voltage of the drain terminal of the synchronous rectifier switching element is input and a ground point, and
the switching power source apparatus further comprises a clamp circuit including a transistor which is provided between the voltage monitoring terminal and the ground point, and is connected to the resistor element in series.

2. The switching power source apparatus according to claim 1, further comprising, on a secondary side of the transformer:
a signal sending unit which sends a signal corresponding to an output voltage of the secondary side to the primary-side control circuit; and
a current control unit which is connected to the signal sending unit in series and controls current that flows into the signal sending unit,
wherein:
the current control unit changes the current that flows into the signal sending unit in response to the detection signal output from the secondary-side control circuit, and
the primary-side control circuit detects a change in the signal sent by the signal sending unit, and stops the ON/OFF control of the main switching element.

3. The switching power source apparatus according to claim 1, further comprising:
a switch unit provided between a terminal of the secondary-side coil of the transformer and a voltage output terminal which outputs a voltage rectified and smoothed on the secondary side, the switch unit supplying/blocking the rectified and smoothed voltage,
wherein the switch unit is ON/OFF controlled in response to the detection signal output from the secondary-side control circuit.

4. The switching power source apparatus according to claim 1, wherein the secondary-side control circuit is configured as one of: (i) a semiconductor integrated circuit provided on one semiconductor chip, and (ii) a semiconductor device in stalled in one package.

5. A direct-current power source apparatus comprising:
the s witching power source apparatus according to claim 1;
a USB Type-C plug connected to an output terminal on a secondary side of the transformer;
a controller which controls the Type-C plug; and
a switch unit connected between a terminal of the secondary-side coil of the transformer and a power supply terminal of the Type-C plug,
wherein:
the detection signal output from the secondary-side control circuit is supplied to the controller, and
the controller controls the switch unit in response to the detection signal.

* * * * *

UNITED STATES PATENT AND TRADEMARK OFFICE
CERTIFICATE OF CORRECTION

| | | |
|---|---|---|
| PATENT NO. | : 10,536,089 B2 | Page 1 of 1 |
| APPLICATION NO. | : 16/249018 | |
| DATED | : January 14, 2020 | |
| INVENTOR(S) | : Takumi Hyugaji and Minoru Kado | |

It is certified that error appears in the above-identified patent and that said Letters Patent is hereby corrected as shown below:

In the Claims

Column 12, Line 44, delete "in stalled" and insert --installed--.

Column 12, Line 46, delete "s witching" and insert --switching--.

Signed and Sealed this
Fifth Day of May, 2020

Andrei Iancu
*Director of the United States Patent and Trademark Office*